(12) United States Patent
Goldbach

(10) Patent No.: US 7,056,802 B2
(45) Date of Patent: Jun. 6, 2006

(54) METHOD FOR FABRICATING A TRENCH CAPACITOR WITH AN INSULATION COLLAR WHICH IS ELECTRICALLY CONNECTED TO A SUBSTRATE ON ONE SIDE VIA A BURIED CONTACT, IN PARTICULAR FOR A SEMICONDUCTOR MEMORY CELL

(75) Inventor: Matthias Goldbach, Dresden (DE)

(73) Assignee: Infineon Technologies AG, Munich (DE)

( * ) Notice: Subject to any disclaimer, the term of this patent is extended or adjusted under 35 U.S.C. 154(b) by 43 days.

(21) Appl. No.: 10/889,670

(22) Filed: Jul. 13, 2004

(65) Prior Publication Data

US 2005/0020024 A1    Jan. 27, 2005

(30) Foreign Application Priority Data

Jul. 24, 2003   (DE) ............................... 103 33 777

(51) Int. Cl.
*H01L 21/22* (2006.01)
(52) U.S. Cl. ................... 438/386; 438/387; 257/301
(58) Field of Classification Search ............... 438/239, 438/243
See application file for complete search history.

(56) References Cited

U.S. PATENT DOCUMENTS

| | | | |
|---|---|---|---|
| 6,426,253 B1 * | 7/2002 | Tews et al. ................ | 438/243 |
| 6,426,526 B1 * | 7/2002 | Divakaruni et al. ........ | 257/302 |
| 6,498,061 B1 * | 12/2002 | Divakaruni et al. ........ | 438/243 |
| 6,916,721 B1 * | 7/2005 | Heineck et al. ............. | 438/389 |
| 2004/0063321 A1 | 4/2004 | Goebel et al. | |
| 2005/0026384 A1 * | 2/2005 | Kudelka et al. ............. | 438/386 |
| 2005/0032324 A1 * | 2/2005 | Kudelka et al. ............. | 438/389 |
| 2005/0054157 A1 * | 3/2005 | Hsu .......................... | 438/243 |
| 2005/0153507 A1 * | 7/2005 | Hecht et al. ................ | 438/243 |

FOREIGN PATENT DOCUMENTS

DE         101 15 912 A1    10/2002

* cited by examiner

*Primary Examiner*—Thao P. Le
(74) *Attorney, Agent, or Firm*—Jenkins, Wilson, Taylor & Hunt, P.A.

(57) ABSTRACT

The present invention provides a method for fabricating a trench capacitor with an insulation collar (10; 10a, 10b) in a substrate (1), which is electrically connected to the substrate (1) on one side via a buried contact (15a, 15b; 70), having the steps of: providing a trench (5) in the substrate (1) using a hard mask (2, 3) with a corresponding mask opening; providing a capacitor dielectric (30) in the lower and central trench region, the insulation collar (10) in the central and upper trench region and an electrically conductive filling (20) in the lower and central trench region, the top side of the electrically conductive filling (20) being sunk in the upper trench region with respect to the top side of the substrate (1); providing a silicon nitride liner (40) above the hard mask (2, 3) and in the trench (5); providing a silicon liner (50) above the silicon nitride liner (40); carrying out an oblique implantation (I1), as a result of which a shaded region (50a) of the silicon liner (50) is made selectively removable with respect to the rest of the silicon liner (50) by means of an etching process; selectively removing the shaded region (50a) of the silicon liner (50) by means of the etching process; oxidizing the rest of the silicon liner (50); carrying out a spacer etching at the oxidized rest of the silicon liner (50'); and depositing and etching back a conductive filling (70) in order to form the buried contact.

5 Claims, 9 Drawing Sheets

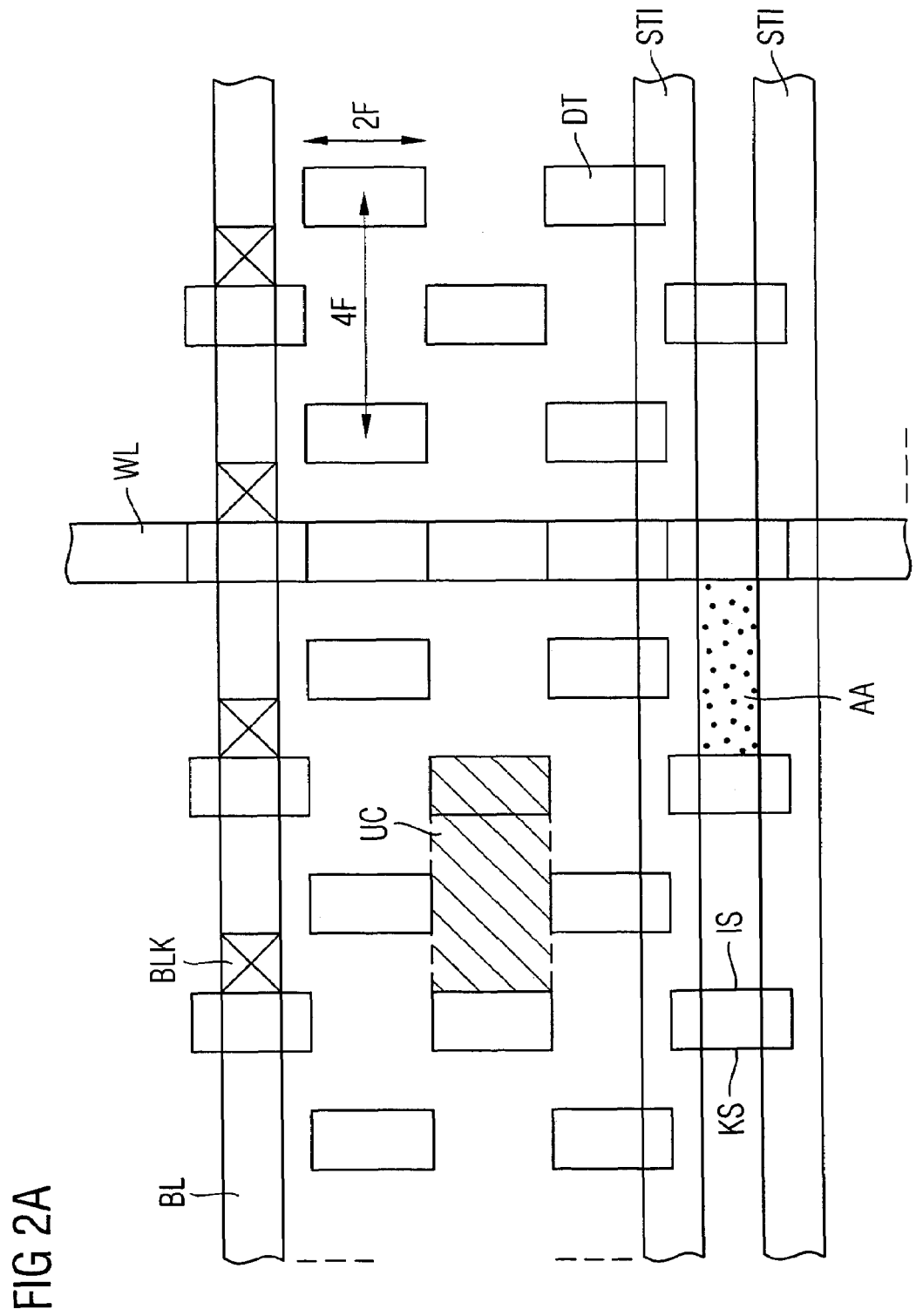

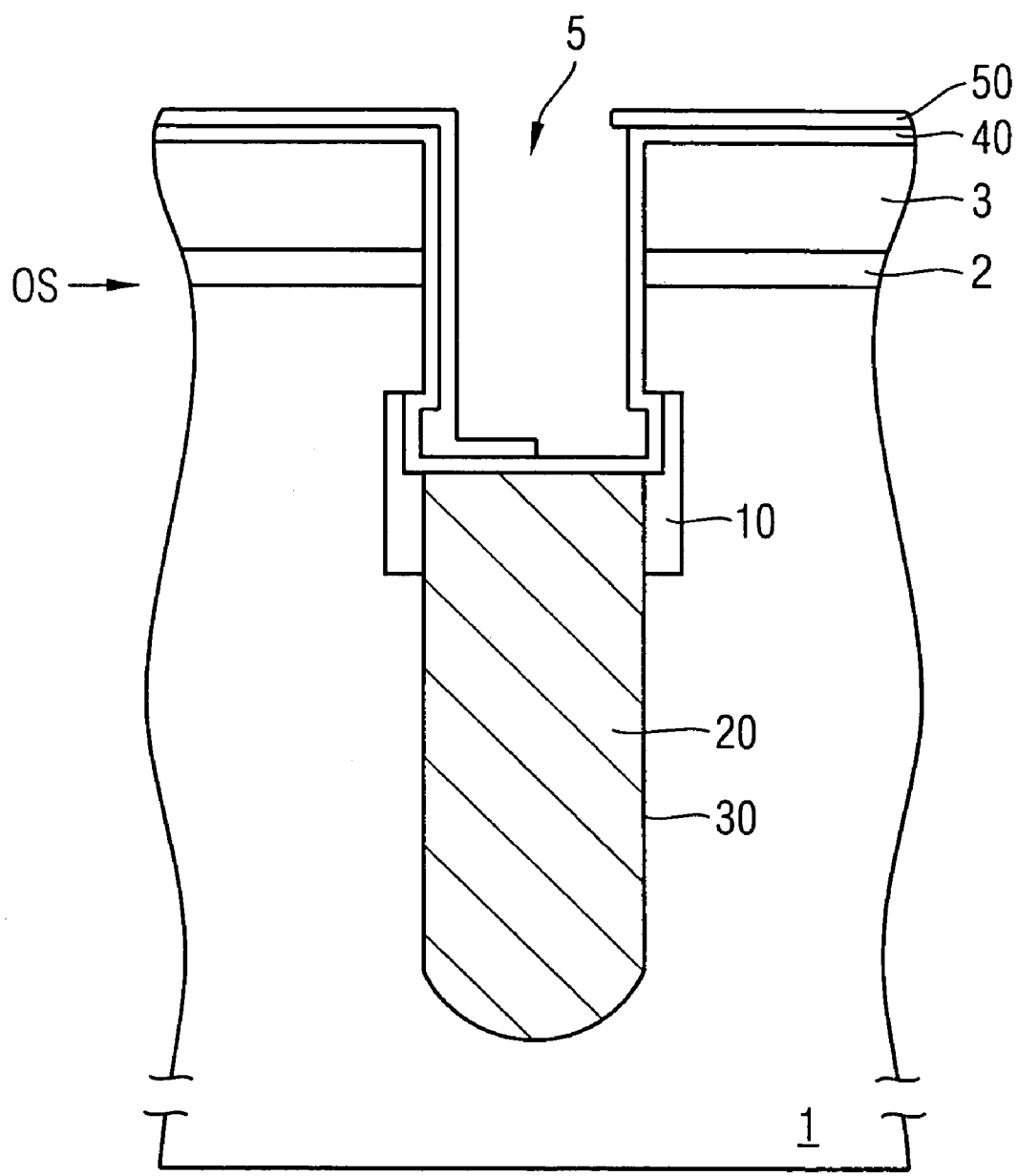

METHOD FOR FABRICATING A TRENCH CAPACITOR WITH AN INSULATION COLLAR WHICH IS ELECTRICALLY CONNECTED TO A SUBSTRATE ON ONE SIDE VIA A BURIED CONTACT, IN PARTICULAR FOR A SEMICONDUCTOR MEMORY CELL

TECHNICAL FIELD

The present invention relates to a method for fabricating a trench capacitor with an insulation collar, which is electrically connected to a substrate on one side via a buried contact, in particular for a semiconductor memory cell.

BACKGROUND ART

Although applicable in principle to any desired integrated circuits, the present invention and the problem area on which it is based are explained with regard to integrated memory circuits in silicon technology.

FIG. 1 shows a diagrammatic sectional illustration of a semiconductor memory cell with a trench capacitor and a planar selection transistor connected thereto.

In FIG. 1, reference symbol 1 designates a silicon semiconductor substrate. Provided in the semiconductor substrate 1 are trench capacitors GK1, GK2 having trenches G1, G2, the electrically conductive fillings 20a, 20b of which form first capacitor electrodes. The conductive fillings 20a, 20b are insulated in the lower and central trench region by a dielectric 30a, 30b from the semiconductor substrate 1, which, for its part, forms the second capacitor electrodes (if appropriate in the form of a buried plate (not shown)).

Provided in the central and upper region of the trenches G1, G2 are peripheral insulation collars 10a, 10b, above which are provided buried contacts 15a, 15b, which are in electrical contact with the conductive fillings 20a, 20b and the adjoining semiconductor substrate 1. The buried contacts 15a, 15b are connected to the semiconductor substrate 1 only on one side (cf. FIGS. 2a, b). Insulation regions 16a, 16b insulate the other side of the substrate from the buried contacts 15a, 15b or insulate the buried contacts 15a, 15b toward the top side of the trenches G1, G2.

This enables a very high packing density of the trench capacitors GK1, GK2 and of the associated selection transistors, which will now be explained. In this case, reference is made principally to the selection transistor which is associated with the trench capacitor GK2, since only the drain region D1 or the source region S3, respectively, of adjacent selection transistors is depicted. The selection transistor associated with the trench capacitor GK2 has a source region S2, a channel region K2 and a drain region D2. The source region S2 is connected via a bit line contact BLK to a bit line (not shown) arranged above an insulation layer I. The drain region D2 is connected to the buried contact 15b on one side. A word line WL2 having a gate stack GS2 and a gate insulator GI2 surrounding the latter runs above the channel region K2. The word line WL2 is an active word line for the selection transistor of the trench capacitor GK2.

Running parallel adjacent to the word line WL2 are word lines WL1 comprising gate stack GS1 and gate insulator GI1 and word line WL3 comprising gate stack GS3 and gate insulator GI3, which are passive word lines for the selection transistor of the trench capacitor GK2. Said word lines WL1, WL3 serve for driving selection transistors which are displaced in the third dimension with respect to the sectional illustration shown.

FIG. 1 illustrates the fact that this type of connection on one side of the buried contact enables the trenches and the adjacent source regions or drain regions of relevant selection transistors to be arranged directly beside one another. As a result, the length of a memory cell may amount to just 4 F and the width to just 2 F, where F is the minimum length unit that can be realized technologically (cf. FIGS. 2a, b).

FIG. 2A shows a plan view of a memory cell array with memory cells in accordance with FIG. 1 in a first arrangement possibility.

Reference symbol DT in FIG. 2A designates trenches which are arranged rowwise with a period of 4 F with respect to one another and columnwise with a period of 2 F. Adjacent rows are displaced by 2 F relative to one another. UC in FIG. 2A designates the area of a unit cell, which amounts to $4 F \times 2 F = 8 F^2$. STI designates isolation trenches which are arranged at a distance of 1 F from one another in the row direction and insulate adjacent active regions from one another. Bit lines BL likewise run at a distance of 1 F from one another in the row direction, whereas the word lines run at a distance of 1 F from one another in the column direction. In this arrangement example, all the trenches DT have a contact region KS of the buried contact to the substrate on the left-hand side and an insulation region IS on the right-hand side (regions 15a, b and 16a, b, respectively, in FIG. 1).

FIG. 2B shows a plan view of a memory cell array with memory cells in accordance with FIG. 1 in a second arrangement possibility.

In this second arrangement possibility, the rows of trenches have alternating connection regions and insulation regions of the buried contacts, respectively. Thus, in the bottommost row of FIG. 2B, the buried contacts are in each case provided with a contact region KS1 on the left-hand side and with an insulation region IS1 on the right-hand side. By contrast, in the row located above that, all the trenches DT are provided with each insulation region IS2 on the left-hand side and with a contact region KS2 on the right-hand side. This arrangement alternates in the column direction.

SUMMARY OF THE INVENTION

The object of the present invention is to specify a simple and reliable method for fabricating such a trench capacitor connected on one side.

According to the invention, this object is achieved by means of the fabrication method specified in claim 1.

The particular advantages of the method according to the invention are that it enables a precise definition of the connection region and of the complementary insulation region in the case of the respective buried contact of the trench capacitor.

Advantageous developments and improvements of the fabrication method specified in claim 1 are found in the subclaims.

In accordance with one preferred development, after carrying out the spacer etching, that part of the silicon nitride liner which is not covered by the oxidized rest of the silicon liner is removed and a further silicon nitride liner is subsequently deposited.

In accordance with a further preferred development, the capacitor dielectric is also provided and left in the upper trench region below the silicon nitride liner.

In accordance with a further preferred development, the implantation is carried out using boron ions or boron fluoride ions or other ions and the etching process is an alkaline etching, in particular an NH$_4$OH etching.

In accordance with a further preferred development, the insulation collar is incorporated into the substrate.

An exemplary embodiment of the invention is illustrated in the drawings and explained in more detail in the description below.

BRIEF DESCRIPTION OF THE DRAWINGS

FIGS. 3A–F show diagrammatic illustrations of successive method stages of a fabrication method as an embodiment of the present invention.

DETAILED DESCRIPTION OF THE INVENTION

In the figures, identical reference symbols designate identical or functionally identical constituent parts.

In the embodiments described below, for reasons of clarity, a portrayal of the fabrication of the planar selection transistors is dispensed with and only the formation of the buried contact of the trench capacitor, which buried contact is connected on one side, is discussed in more detail. Unless expressly mentioned otherwise, the steps of fabricating the planar selection transistors are the same as in the prior art.

FIGS. 3A–F are diagrammatic illustrations of successive method stages of a fabrication method as an embodiment of the present invention.

Figure 1:
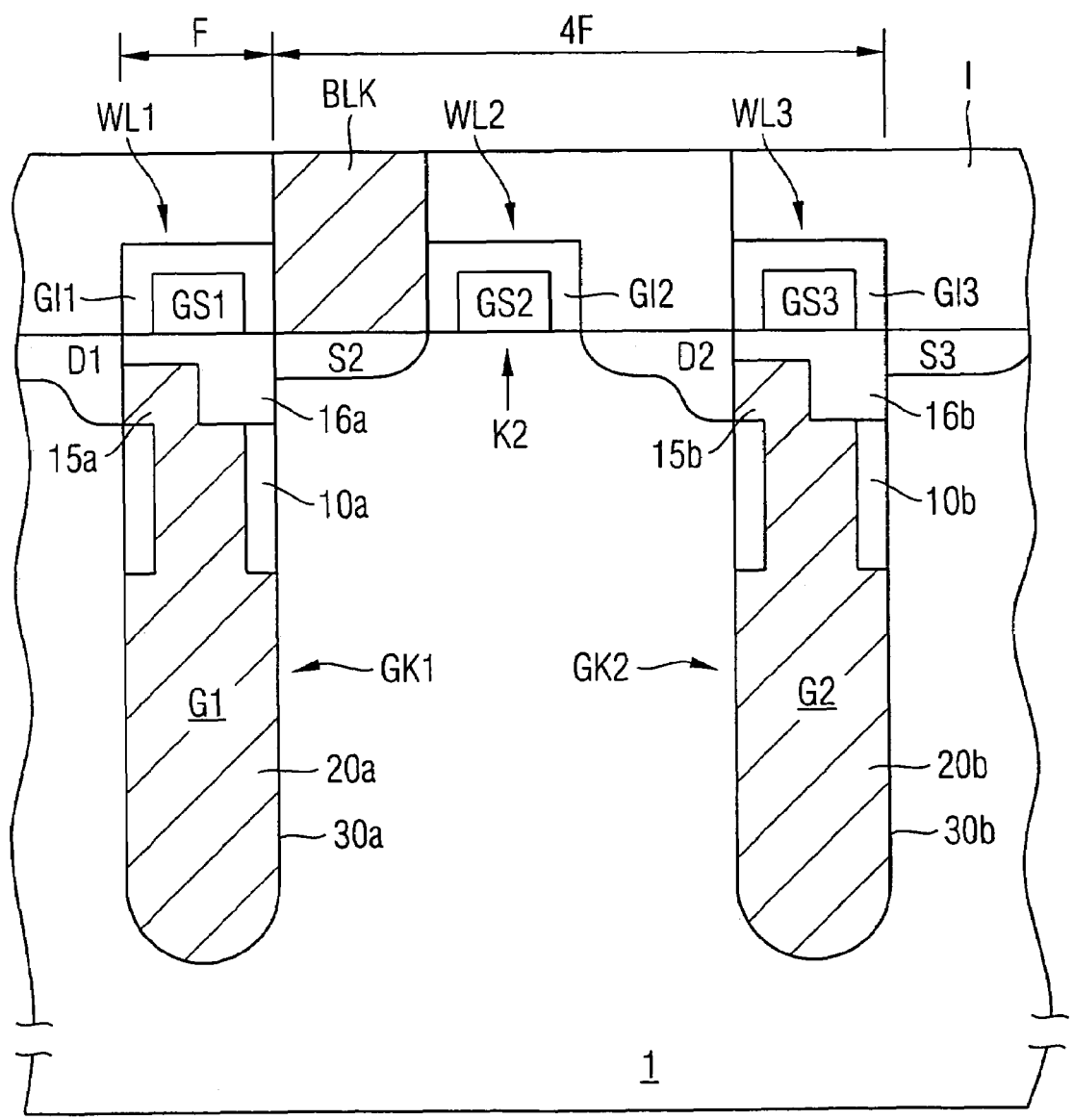
FIG. 1 shows a diagrammatic sectional illustration of a semiconductor memory cell with a trench capacitor and a planar selection transistor connected thereto.
Figure 2B:
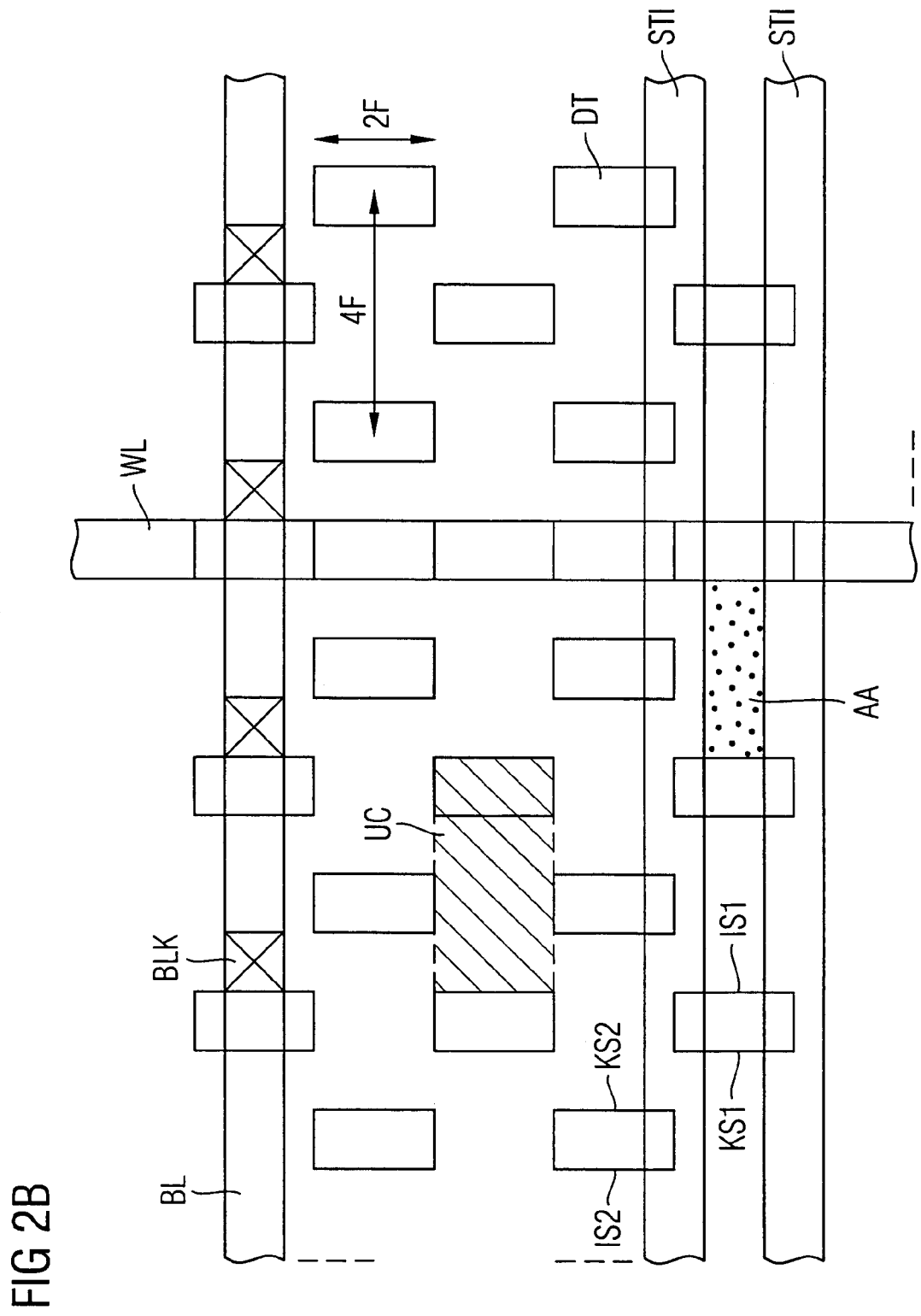
FIGS. 2A, B shows a respective plan view of a memory cell array with memory cells in accordance with FIG. 1 in a first and second arrangement possibility.
Figure 3A:
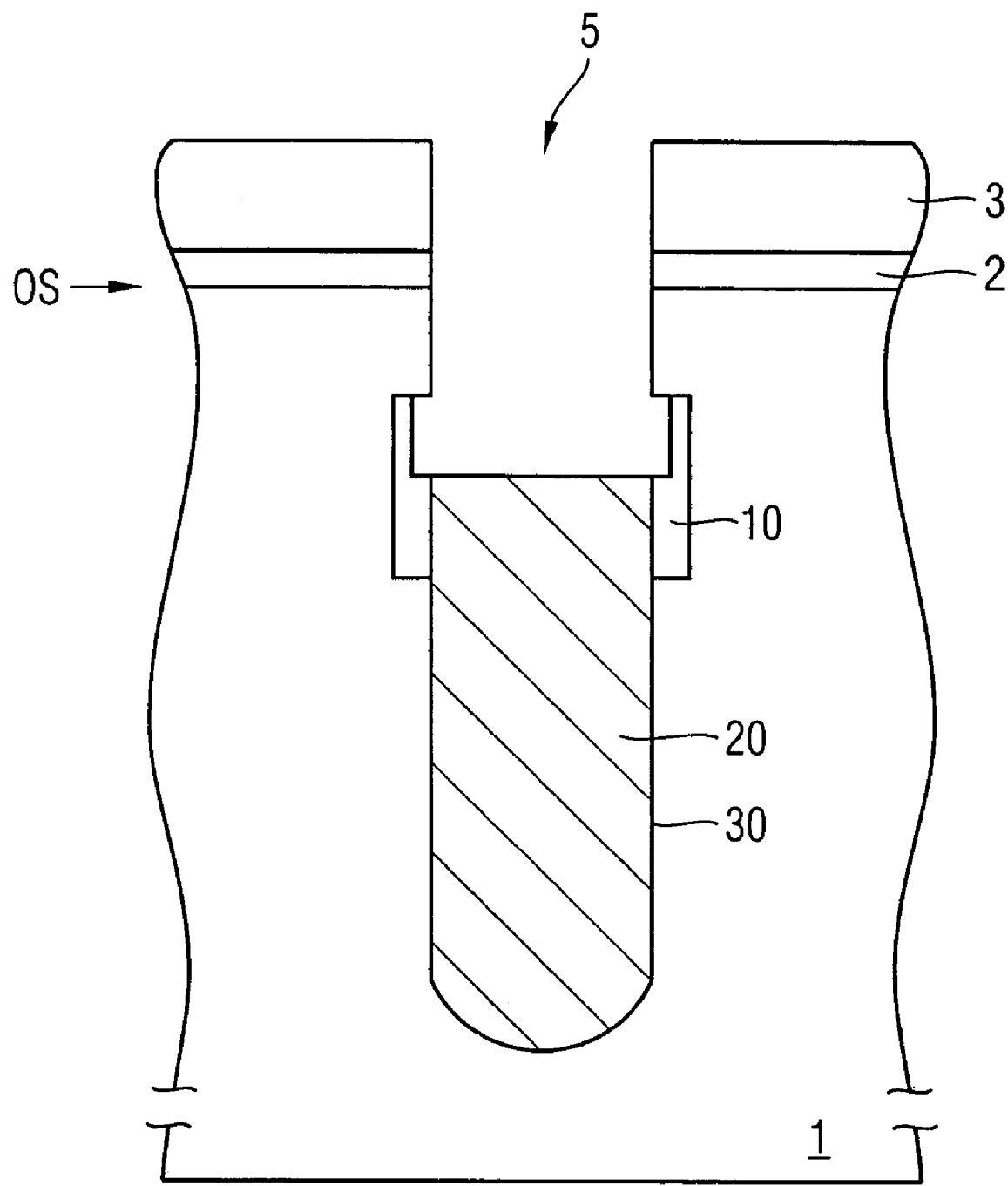

In FIG. 3A, reference symbol 5 designates a trench provided in the silicon semiconductor substrate 1. Provided on the top side OS of the semiconductor substrate 1 is a hard mask comprising a pad oxide layer 2 and a pad nitride layer 3. A dielectric 30 is provided in the lower and central region of the trench 5, said dielectric insulating an electrically conductive filling 20 from the surrounding semiconductor substrate 1. A peripheral insulation collar 10 incorporated into the substrate 1 is provided in the upper and central region of the trench 5. An exemplary material for the insulation collar 10 is silicon oxide, and polysilicon for the electrically conductive filling 20. However, other material combinations are also conceivable, of course.

After the polysilicon filling 20 has been sunk to below the top side of the insulation collar 10, the capacitor dielectric 30 is removed in the upper trench region by means of etching, part of the top side of the insulation collar 10 also being removed, as can clearly be discerned in FIG. 3A.

Figure 3B:
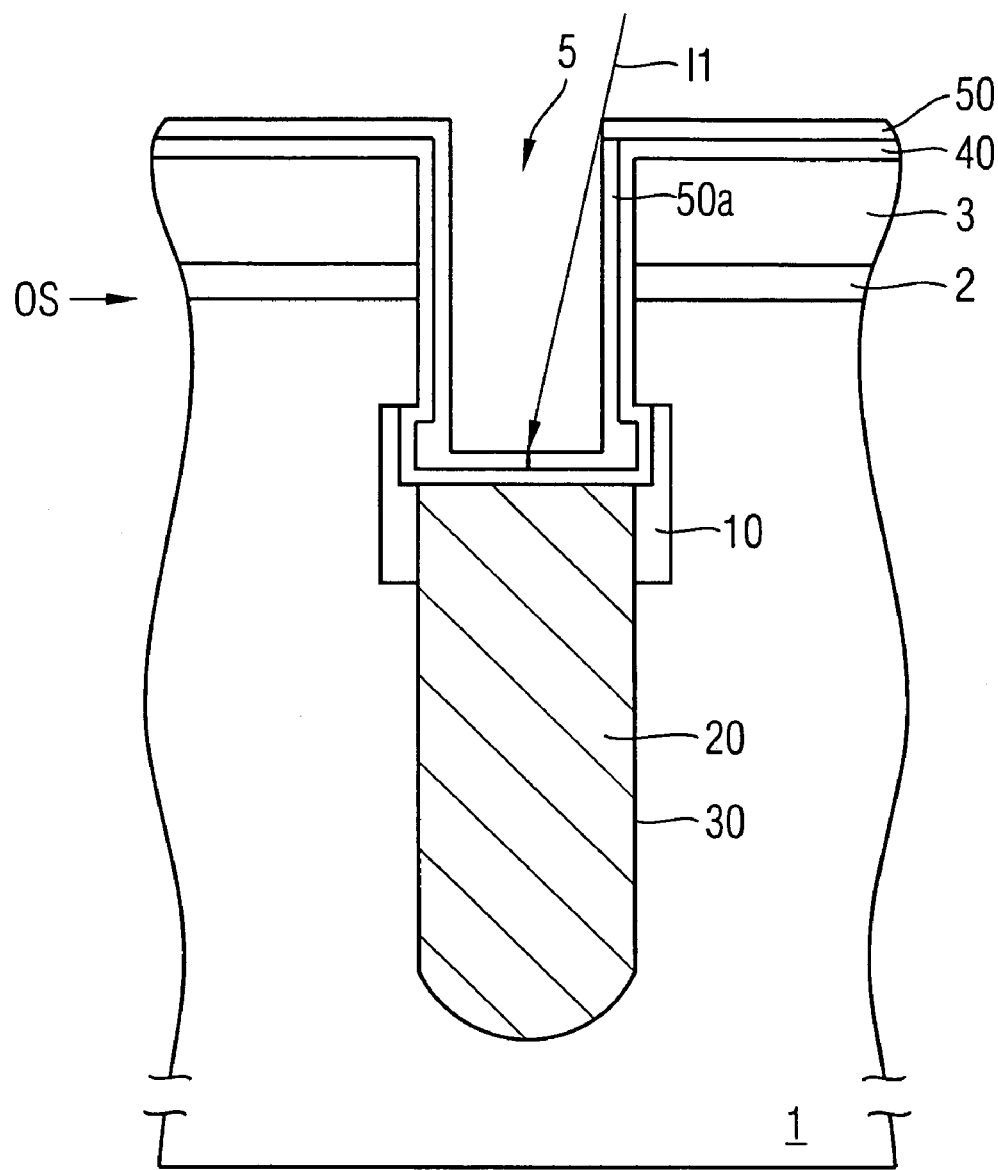

With reference to FIG. 3B, firstly a silicon nitride liner 40 is then produced above the resulting structure, followed by the deposition of an amorphous silicon liner 50. The silicon nitride liner 40 has a thickness of typically 20 nm and the amorphous silicon liner 50 has a thickness of typically 10 nm.

Afterward, an oblique implantation I1 of boron ions or other ions onto the silicon liner 50 is effected, the region 50a remaining shaded. In the process, the etching properties of the implanted region are altered relative to the shaded region 50a in such a way that the shaded region 50a can be etched significantly faster in NH$_4$OH or other alkaline etching media.

This is exploited in accordance with FIG. 3C insofar as the shaded region 50a is removed selectively with respect to the rest of the silicon liner 50 by means of the NH$_4$OH etching.

Figure 3D:
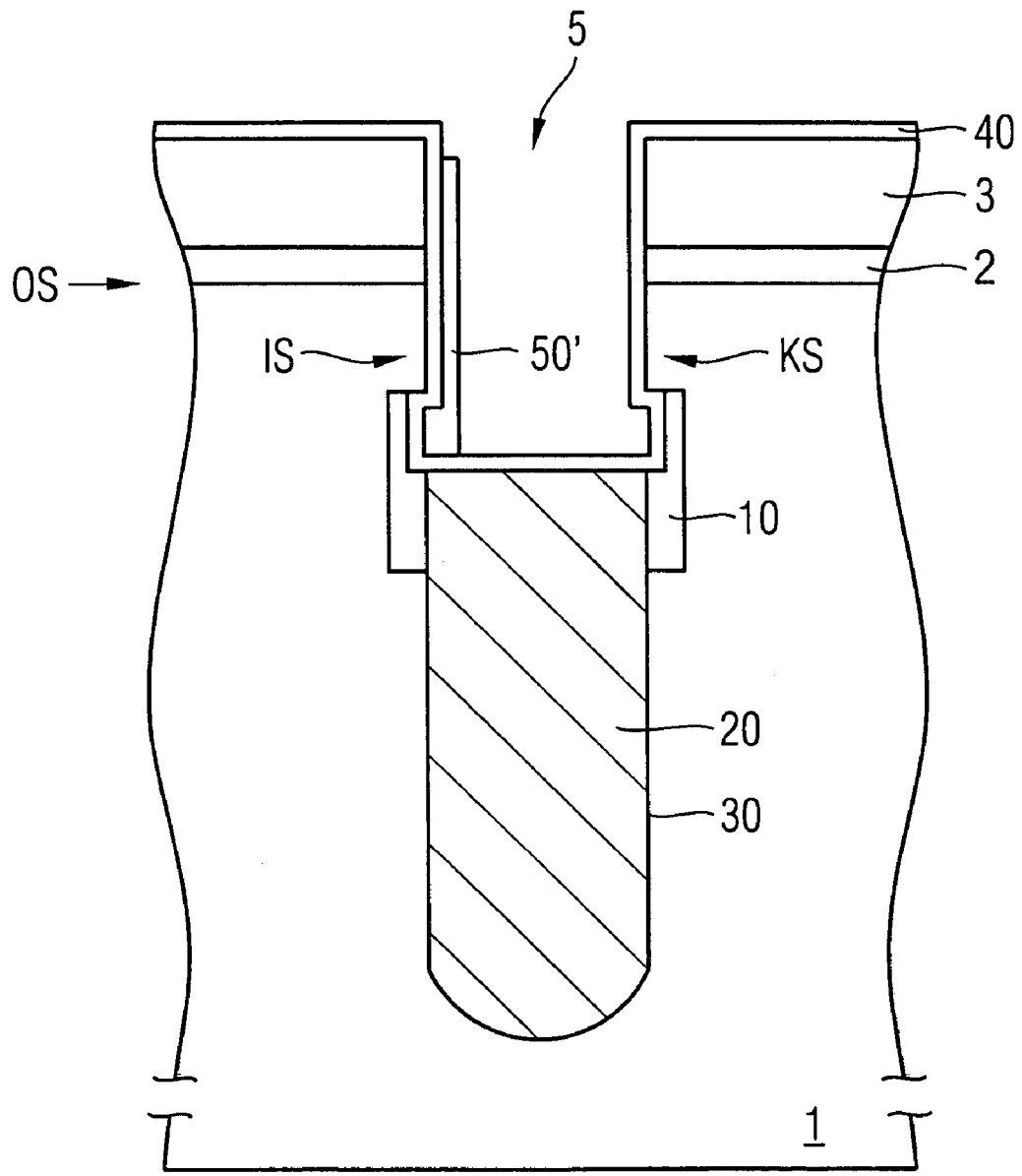

Furthermore, with reference to FIG. 3D, an oxidation of the remaining silicon liner 50 is then effected and an anisotropic spacer etching, e.g. a plasma etching, is subsequently effected in order to leave only an oxidized spacer region 50' of the original liner 50 on the later insulation side IS, as can be discerned in FIG. 3D.

Figure 3E:
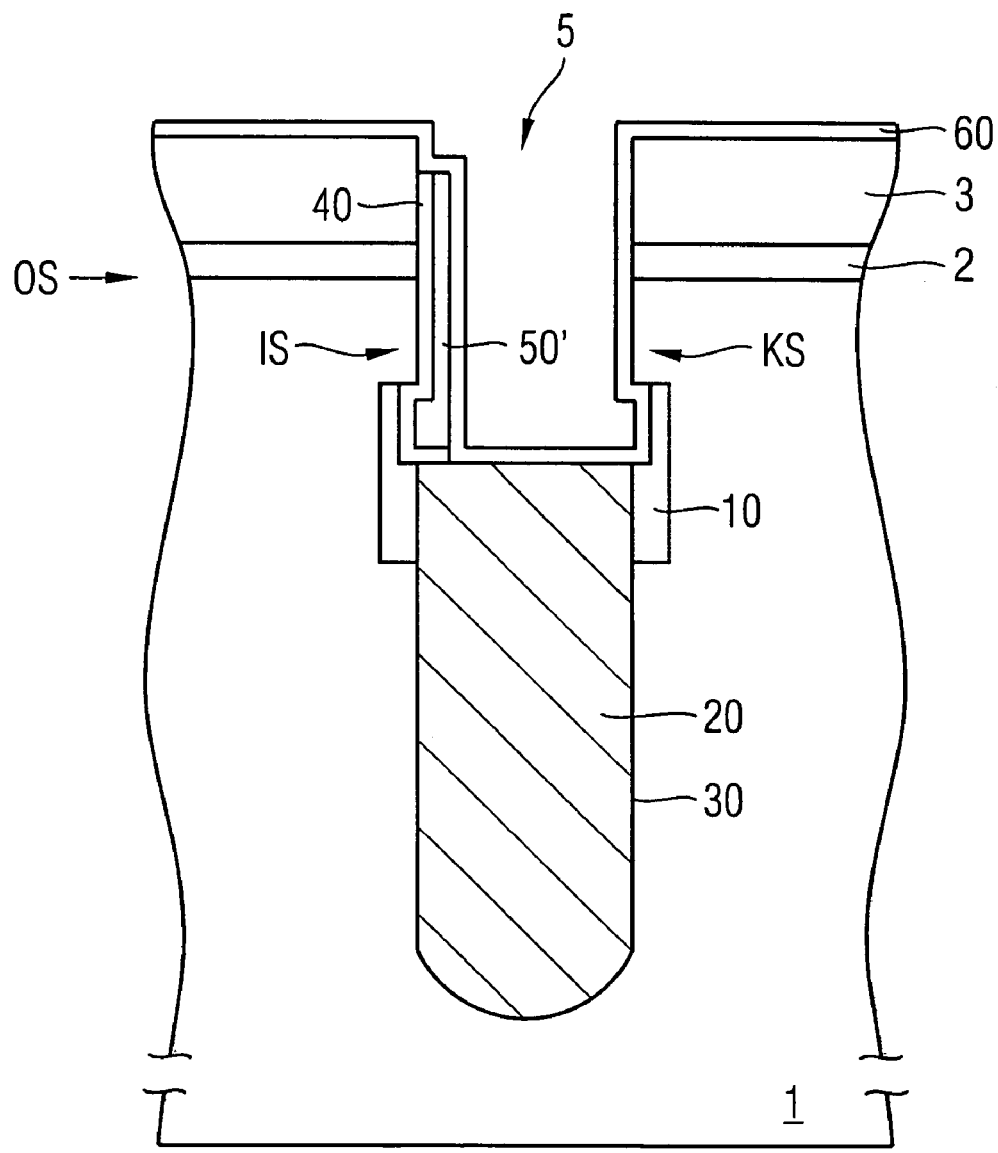

Furthermore, with reference to FIG. 3E, the silicon nitride liner 40 is then removed by means of an etching everywhere where it is not covered by the oxidized liner region 50'. Afterward, a thin silicon nitride liner 60 is once again produced above the resulting structure in order, in particular, to condition the contact point in the later contact region KS.

Figure 3F:
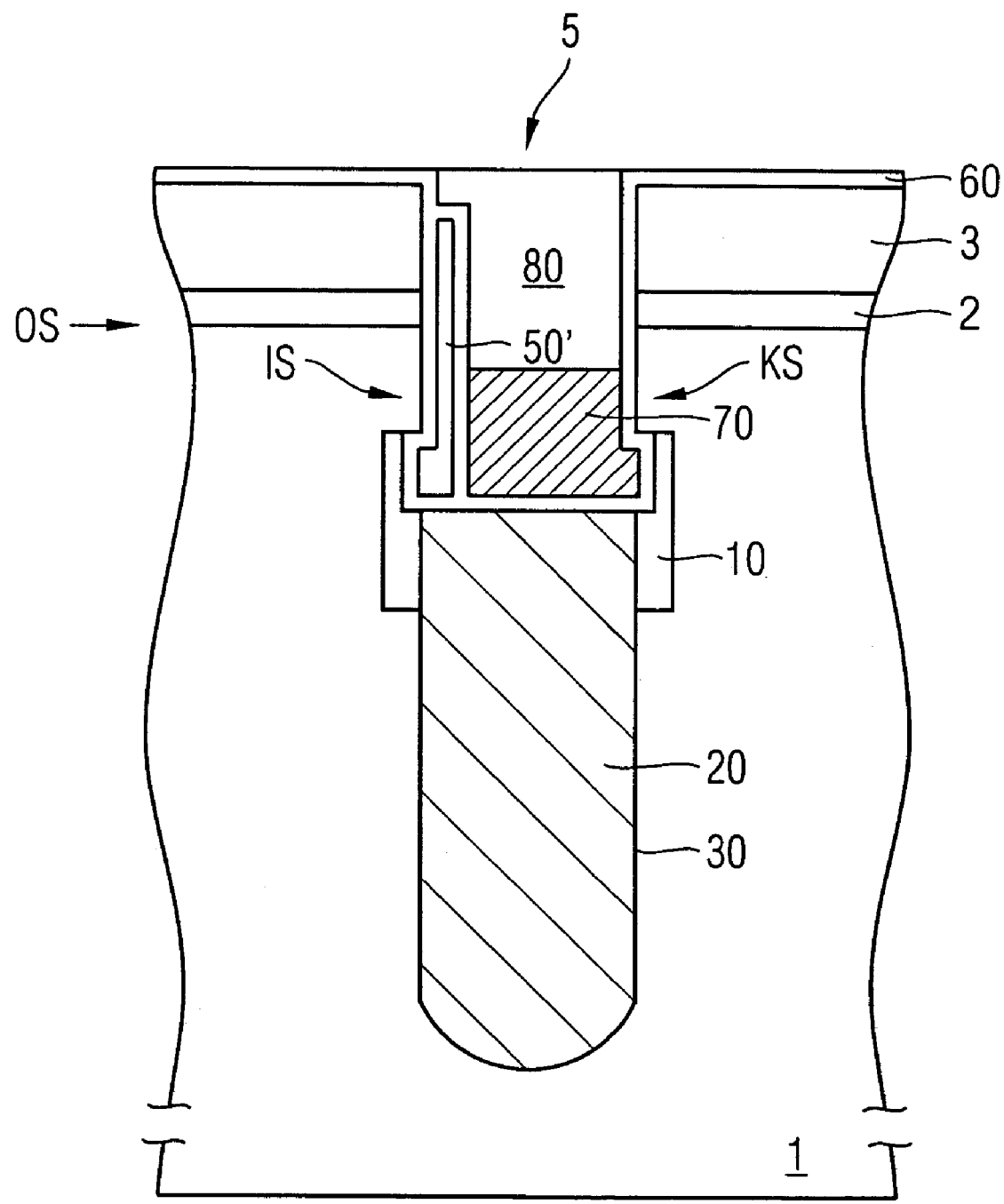

Finally, with reference to FIG. 3F, a conductive polysilicon filling 70 is deposited and etched back in order to form the buried contact with the contact region KS, and an insulation cover 80 made of silicon oxide is subsequently deposited and etched back.

Particular advantages of the method according to the invention reside in its insensitivity toward shrink holes in the polysilicon filling on account of the deposition of the silicon liner and in the fact that the implantation angle is only influenced by the smallest critical dimension. Disadvantages on account of boron ions remaining in the oxidized silicon or on account of the thin silicon nitride liner incorporated are not expected. Further advantages reside in the availability of the entire trench opening after the spacer etching and in the noncritical depth with regard to the polyrecess and the implantation.

Although the present invention has been described above on the basis of a preferred exemplary embodiment, it is not restricted thereto, but rather can be modified in diverse ways.

In particular, the selection of the layer materials is only by way of example and can be varied in many different ways.

Moreover, the invention is not restricted to the insulation collar incorporated into the substrate but rather can also be used for conventional insulation collars placed onto the trench wall.

Depending on the selectivity between oxide and capacitor dielectric, the capacitor dielectric in accordance with FIG. 3A may be left in the trench.

In addition to boron ions, it is also possible, in principle, to use other either nondoping or differently doping ions during the implantation.

What is claimed is:

1. Method for fabricating a trench capacitor with an insulation collar in a substrate, which is electrically connected to the substrate on one side via a buried contact, in particular for a semiconductor memory cell with a planar selection transistor that is provided in the substrate and connected via the buried contact having the steps of:

(a) providing a trench in the substrate using a hard mask with a corresponding mask opening;

(b) providing a capacitor dielectric in the lower and central trench region, the insulation collar in the central and upper trench region and an electrically conductive filling in the lower and central trench region, the top side of the electrically conductive filling being sunk in the upper trench region with respect to the top side of the substrate;

(c) providing a silicon nitride liner above the hard mask and in the trench;

(d) providing a silicon liner above the silicon nitride liner;
(e) carrying out an oblique implantation, as a result of which a shaded region of the silicon liner is made selectively removable with respect to the rest of the silicon liner by means of an etching process;
(f) selectively removing the shaded region of the silicon liner by means of the etching process;
(g) oxidizing the rest of the silicon liner;
(h) carrying out a spacer etching at the oxidized rest of the silicon liner; and
(i) depositing and etching back a conductive filling in order to form the buried contact.

2. Method according to claim 1, wherein, after carrying out the spacer etching, that part of the silicon nitride liner which is not covered by the oxidized rest of the silicon liner is removed and a further silicon nitride liner is subsequently deposited.

3. Method according to claim 1 wherein the capacitor dielectric is also provided and left in the upper trench region below the silicon nitride liner.

4. Method according to claim 1, wherein the implantation is carried out using boron ions or boron fluoride ions or other ions and the etching process is an alkaline etching, in particular an $NH_4OH$ etching.

5. Method according to claim 1, wherein the insulation collar is incorporated into the substrate.

* * * * *